(12) United States Patent
Teo et al.

(10) Patent No.: US 10,411,125 B2
(45) Date of Patent: Sep. 10, 2019

(54) SEMICONDUCTOR DEVICE HAVING HIGH LINEARITY-TRANSCONDUCTANCE

(71) Applicant: Mitsubishi Electric Research Laboratories, Inc., Cambridge, MA (US)

(72) Inventors: Koon Hoo Teo, Lexington, MA (US); Chenjie Tang, Chicago, IL (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 0 days.

(21) Appl. No.: 15/359,636

(22) Filed: Nov. 23, 2016

(65) Prior Publication Data

US 2018/0145163 A1 May 24, 2018

(51) Int. Cl.
*H01L 29/778* (2006.01)
*H01L 29/06* (2006.01)
*H01L 29/20* (2006.01)
*H01L 29/205* (2006.01)
*H01L 29/36* (2006.01)
*H01L 29/10* (2006.01)

(52) U.S. Cl.
CPC .......... *H01L 29/7786* (2013.01); *H01L 29/06* (2013.01); *H01L 29/2003* (2013.01); *H01L 29/205* (2013.01); *H01L 29/365* (2013.01); *H01L 29/7787* (2013.01); *H01L 29/1075* (2013.01)

(58) Field of Classification Search
CPC ... H01L 29/122–127; H01L 29/15–158; H01L 29/66431; H01L 29/66462; H01L 29/778–7789

USPC .......................................................... 257/76
See application file for complete search history.

(56) References Cited

U.S. PATENT DOCUMENTS

| | | | |
|---|---|---|---|
| 2001/0017370 | A1 | 8/2001 | Sheppard et al. |
| 2002/0096692 | A1 | 7/2002 | Nakamura et al. |
| 2006/0255364 | A1 | 11/2006 | Saxler et al. |
| 2013/0062664 | A1* | 3/2013 | Takeuchi ............ H01L 29/7785 257/190 |

(Continued)

FOREIGN PATENT DOCUMENTS

KR      20100089464 A      8/2010

OTHER PUBLICATIONS

Liu et al. "Highly Linear Al0:3Ga0:7N-Al0:05Ga0:95N-GaN Composite-Channel HEMTs." IEEE Electron Device Letters, vol. 26, No. 3, Mar. 2005. pp. 145-147.

(Continued)

*Primary Examiner* — Anthony Ho
*Assistant Examiner* — Mohammad M Hoque
(74) *Attorney, Agent, or Firm* — Gennadiy Vinokur; James McAleenan; Hironori Tsukamoto

(57) ABSTRACT

A semiconductor device includes a semiconductor structure including a first doped layer for forming a carrier channel having a carrier charge, a second doped layer having a conductivity type identical to a conductivity type of the first doped layer, a barrier layer arranged in proximity to the semiconductor structure via the second doped layer, wherein the barrier layer includes a partially doped layer having a conductivity type opposite to the conductivity type of the second doped layer, and a set of electrodes for providing and controlling the carrier charge in the carrier channel.

15 Claims, 10 Drawing Sheets

(56) References Cited

U.S. PATENT DOCUMENTS

2014/0312357 A1  10/2014 Inoue
2015/0221760 A1* 8/2015 Kub ................. H01L 29/41725
                                              257/76
2016/0163845 A1* 6/2016 Endoh ................ H01L 29/365
                                              257/194

OTHER PUBLICATIONS

Uren et al. "Punch-Through in Short-Channel AlGaN/GaN HFETs," IEEE Transactions on Electron Devices, vol. 53, No. 2, Feb. 2006. pp. 395-398.
Palacios et al. "Use of Double-Channel Heterostructures to Improve the Access Resistance and Linearity in GaN-Based HEMTs." IEEE Transactions on Electron Devices, vol. 53, No. 3, Mar. 2006. pp. 562-565.

\* cited by examiner

SEMICONDUCTOR DEVICE HAVING HIGH LINEARITY-TRANSCONDUCTANCE

FIELD OF THE INVENTION

This invention relates generally to semiconductor devices, and more particularly to semiconductor devices with high linearity-transconductance.

BACKGROUND OF THE INVENTION

A nitride semiconductor device is used for high-power and high-frequency applications, due to its outstanding combination of fundamental physical properties, such as large band gaps, large breakdown fields, high electron mobilities, etc. In order to achieve the gain and efficiency requirements at K-band and above, the natural way is to achieve low gate capacitance by reducing gate length. However, GaN high electron mobility transistors (HEMTs) are vulnerable to short-channel effects like all field effect transistors (FETs) when gate length scales below 0.2 µm. The short-channel effects take the form of a drain dependent pinch-off voltage, the loss of saturation on output current including a linearity of a transconductance, a large off-state drain leakage current and low breakdown voltage.

Linearity of a transconductance is an important factor for RF power amplifiers due to the large dynamic range in the variable envelop of the modulation signals. An ideally linear FET device would possess constant drain transconductance over a wide range of input gate-source voltages. The problems in achieving flat transconductance are related to (1) small absolute distance between 2DEG and gate, (2) the increase of the access resistance at high drain current levels caused by quasi-saturation of the electron velocity, and (3) large transverse electric-field (E-field) perpendicular to the channel and the barrier/channel interface at the high current levels.

Thus, there is a need for a GaN material transistor structure that provides a high electron mobility channel having a linear transconductance with suppressed short channel effect for RF applications.

SUMMARY OF THE INVENTION

Some embodiments are based on recognition that a way of improving the linearity of a transcondcutance of a transistor is related to modifying the access resistance using multi-channel heterostructures or forming a minor channel near a main channel using composite-channel design. Another possible way is to create a minor channel by introducing n-doped layer below the channel layer of AlGaN/GaN HEMT with an n-GaN layer introduced in a buffer layer.

Some embodiments of a semiconductor device according to the invention semiconductor device comprises a semiconductor structure including a first doped layer for forming a carrier channel having a carrier charge; a second doped layer having a conductivity type identical to a conductivity type of the first doped layer; a barrier layer arranged in proximity to the semiconductor structure via the second doped layer, wherein the barrier layer includes a partially doped layer having a conductivity type opposite to the conductivity type of the second doped layer; and a set of electrodes for providing and controlling the carrier charge in the carrier channel.

Another embodiment of the invention discloses that a semiconductor device comprises a semiconductor structure including a channel layer, first barrier layers for providing a carrier charge, wherein the channel layer is undoped layer and the first barrier layers consist of a undoped barrier, a first n-type doped barrier and another undoped barrier; a second n-type doped layer adjacent to the channel; a second barrier layer arranged in proximity to the semiconductor structure via the second n-type doped layer, wherein the second barrier layer includes at least partially p-typed doped layer; and a set of electrodes for controlling the carrier charge in the carrier channel.

Still another embodiment of the invention discloses a method for designing a semiconductor device. The method comprises selecting a III-V semiconductor heterostructure including a channel layer and first barrier layers for providing a carrier charge wherein the channel layer is undoped layer and the first barrier layers consist of a undoped barrier, a first n-type doped barrier and another undoped barrier, wherein a bandgap of a material of the first barrier layers is selected so as to be greater than a bandgap of a material of the channel layer; arranging a second n-type doped layer adjacent to the channel layer; selecting a second barrier layer of a III-V semiconductor in proximity to the channel layer via the second n-type doped layer, wherein the second barrier layer includes a partially p-typed doped layer; and providing a set of electrodes for controlling the carrier charge in the carrier channel.

The forgoing and other objects, features and effects of the invention will become more apparent from the following detailed description of the embodiments with reference to the attached drawings.

DETAILED DESCRIPTION OF THE PREFERRED EMBODIMENTS

Figure 1A:
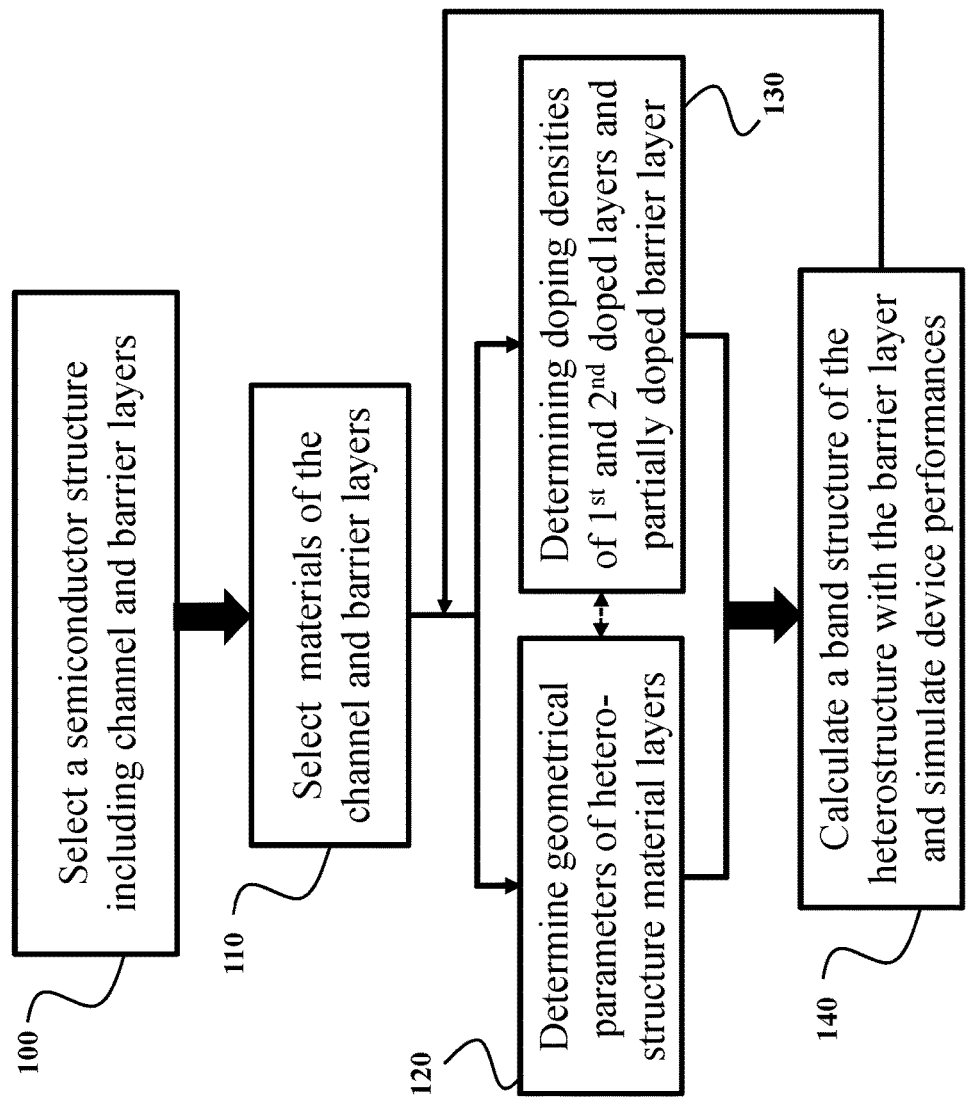
FIG. 1A shows a designing process of a semiconductor device having a semiconductor structure including a channel and barrier layers.

Various embodiments of the invention are described hereafter with reference to the figures. It would be noted that the figures are not drawn to scale elements of similar structures or functions are represented by like reference numerals throughout the figures. It should be also noted that the figures are only intended to facilitate the description of specific embodiments of the invention. They are not intended as an exhaustive description of the invention or as a limitation on the scope of the invention. In addition, an aspect described in conjunction with a particular embodiment of the invention is not necessarily limited to that embodiment and can be practiced in any other embodiments of the invention.

Some embodiments are based on recognition that a semiconductor device is consisted of an i-n-i barrier, a delta-doped n-GaN layer inserted in a buffer and a back barrier, which can provide (a) a high device linearity of transconductance, and suppress (b) short channel effect.

The short channel effects originate from poor confinement of electrons in the channel, resulting in current flowing within the bulk of the GaN layer. A back barrier structure can be used to improve carrier confinement, which prevents electron punch-through and suppress short channel effect. The back-barrier structure for the electron confinement enhancement can be a p-type GaN or some materials having a larger bandgap than the bandgap of GaN.

Improving the linearity of a transconductance of a transistor can be realized by creating a minor channel through inserting an n-doped layer in buffer layer. However, due to the large polarization field in AlGaN/GaN HEMT, and the limitation of uniform doping density in n-GaN inserted layer, it would be very hard to form a secondary channel to achieve good device linearity. Delta doping (δ-doping) can be a technique to significantly increase doping density, as the maximum uniform doping density is limited by the available Si source. Si delta-doping in GaN layer can provide a sheet concentration as high as $1\times10^{12}$ cm$^{-2}$ to $2\times10^{13}$ cm$^{-2}$, while the Si uniform-doping in GaN can only achieve concentration up to a few $10^{19}$ cm$^{-3}$ which is equivalent a range of a sheet concentration<$10^{12}$ cm$^{-2}$. In addition, high density uniform doping in GaN would introduce a significant amount of strain which can cause cracking of layers, while Si delta-doping is a method to reduce tensile stress as well as obtaining high doping density. Moreover, Si δ-doping has other benefits in enhancing electron mobility, decreasing defect densities and reducing threading edge dislocation density.

In some embodiments, a semiconductor device is formed on a substrate and includes a back barrier layer, an unintentional doped buffer layer, an inserted n-type δ-doped layer, an unintentionally doped channel layer, an i-n-i barrier layer, and a source electrode, a drain electrode and a T-shape gate electrode on the barrier layer, and a passivation layer over the top of the whole device. The semiconductor device may be an AlGaN/GaN high-electron-mobility transistor (HEMT), which provides advantages in achieving ultra-flat transconductance, suppressing short channel effect and obtaining large on-state current.

More specifically, the semiconductor device may include a back barrier layer on a substrate, followed by an unintentional doped buffer, then an inserted n-type δ-doped layer, an unintentional doped channel layer, an i-n-i barrier layer, and then a source electrode, a drain electrode and a T-shape gate electrode on the barrier layer, and a passivation layer over the top of the whole device. A major channel (or major electron channel) is formed by polarization between barrier layer and channel layer, and a minor channel is formed by arranging a heavily n-type δ-doped layer. The major channel may be referred to as a first channel and the minor channel may be referred to as a second channel. The barrier layer is a stack of a thin unintentionally doped layer, an n-doped layer followed by another thin unintentionally doped layer. In the following, proposed HEMT structures in accordance with some embodiments of the invention will be described.

Some embodiments of the invention are based on a recognition that a semiconductor device is designed for a power amplifier by selecting a semiconductor heterostructure that includes channel and barrier layers. For instance, a method for designing the semiconductor device includes selecting a III-V semiconductor heterostructure including a channel layer and first barrier layers for providing a carrier charge, wherein the channel layer is undoped layer and the first barrier layers consist of a undoped barrier, a first n-type doped barrier and another undoped barrier, wherein a bandgap of a material of the first barrier layers is selected so as to be greater than a bandgap of a material of the channel layer. Further, a second n-type doped layer adjacent to the channel layer is arranged, and a second barrier layer of a III-V semiconductor is arranged in proximity to the channel layer via the second n-type doped layer, wherein the second barrier layer includes a partially p-typed doped layer, and then the structure of the semiconductor device is obtained by providing a set of electrodes for the semiconductor heterostructure for controlling the carrier charge in the carrier channel.

FIG. 1A shows a method for designing a semiconductor device having a semiconductor structure including a channel and barrier layers.

A semiconductor structure which includes a channel layer and barrier layers is determined (selected) for manufacturing a semiconductor device. The semiconductor device can be applied for an RF power amplifier. After selecting the semiconductor structure in step 100, such as a transistor structure including the channel and barrier layers, materials of the channel layer and barrier layers are selected in step 110. Subsequently, the geometrical parameters, such as thicknesses of the layers, positions of doping layers in the semiconductor structure are determined in steps 120 and 130. In this case, the geometrical parameters may include sizes of a gate electrode, a source electrode, and a drain electrode. Further, doping densities of doped layers and a partially doped barrier layer in the semiconductor structure as well as impurities of the first and second doping layers and the partially doped barrier layer, amounts of compositions in compound semiconductor materials are determined. For instance, the n-type doping layer may be silicon (Si) doped layers, and the p-type doping layer may be a magnesium (Mg) or carbon (C) doped layer.

Based on the determinations above, an energy band structure (band structure) of the semiconductor device is simulated. For instance, the band structure may be calculated (simulated) from the channel layer to the partially doped barrier layer. A device performance is simulated based on the semiconductor structure described above. After simulating a device performance in step 140, a linearity of a transconductance of the semiconductor device is characterized based on a transconductance profile as a function of voltages between the gate and source electrodes at a predetermined constant drain voltage. According to an evaluation result of the device performance, steps 120 and 130 may be performed repeatedly.

Figure 1C:
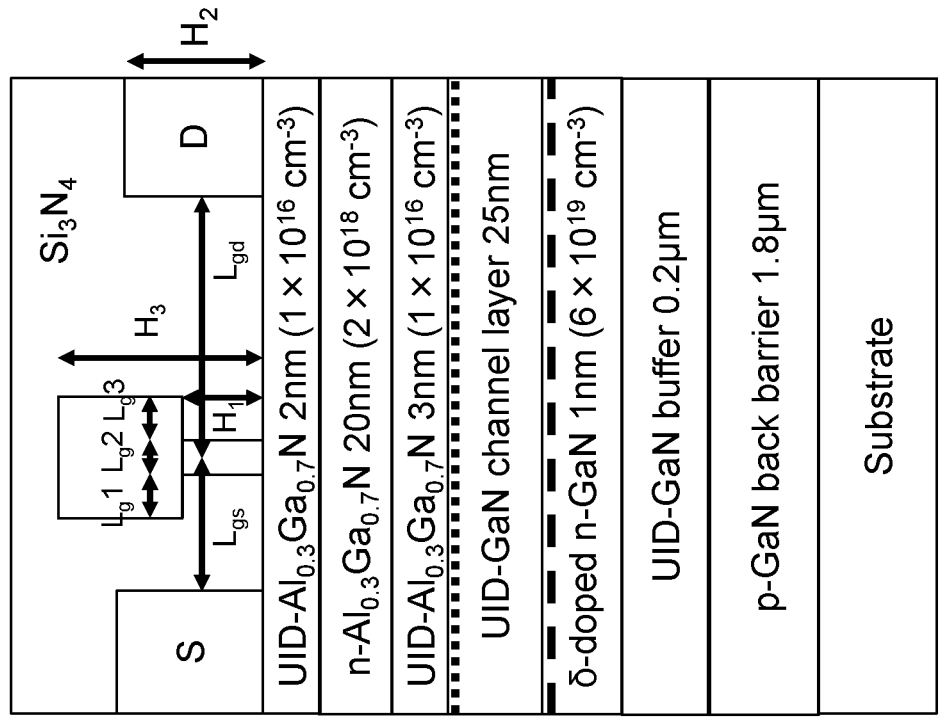
FIG. 1B and FIG. 1C show a cross-sectional diagram of a semiconductor device according to some embodiments of the invention.
Figure 1B:
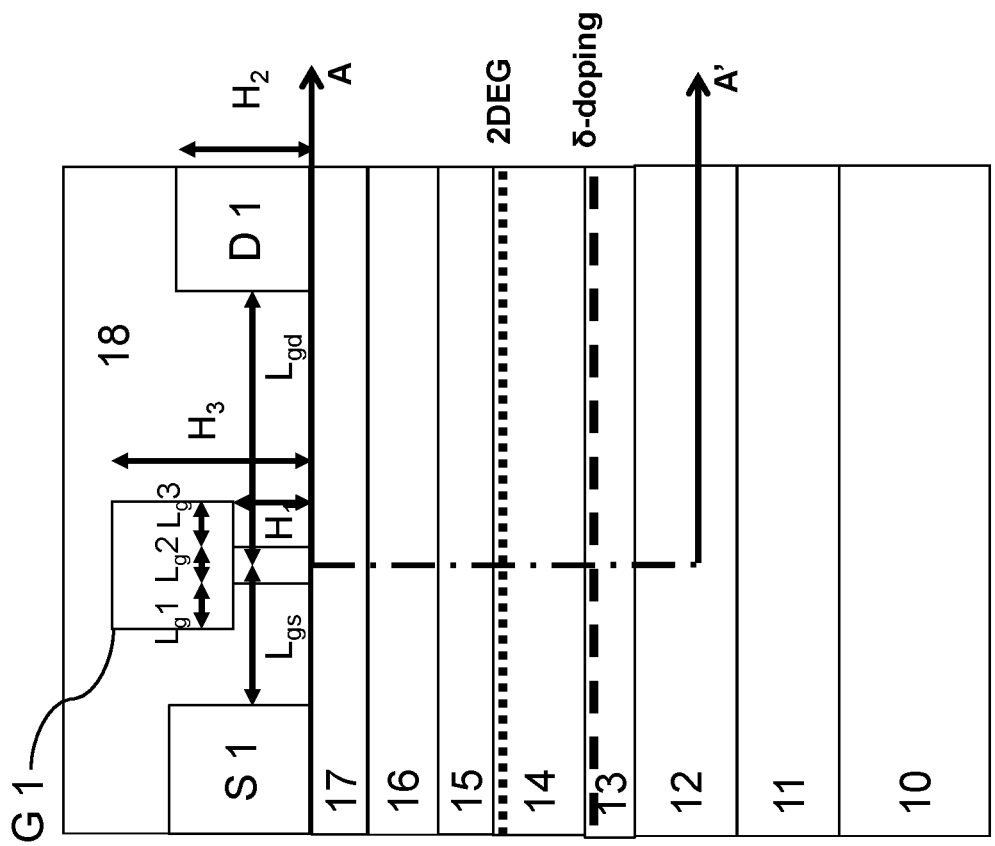

FIG. 1B and FIG. 1C show a cross-sectional diagram of a semiconductor device according to some embodiments of the invention. The figures illustrate a structure of a high-electron mobility transistor (HEMT) as an example of the semiconductor device.

FIG. 1B is the cross-sectional diagram of a semiconductor device according to some embodiments of the invention. The semiconductor device includes a substrate layer 10. The substrate layer 10 may be Si, SiC, sapphire and diamond. Further, the substrate layer 10 can be a single substrate layer or include multiple layers such as transition layers between substrate layer and the doped layer 11. The doped layer 11 is a back-barrier layer that is fully or partially doped by impurities with a conductivity type opposite to the conductivity type of the carrier channel 14.

According to some embodiments of the invention, various methods can be adopted for the formation of a substrate region 10 (substrate 10), including but not limiting to a Chemical Vapor Deposition (CVD), a Metal-Organic Chemical Vapor Deposition (MOCVD), a DC plasma CVD. The back-barrier layer 11 is disposed on the substrate region 10, with an exemplary thickness of 2 μm. The material of layer 11 can be p-GaN, AlGaN, InGaN and p-diamond. For the doped layer 11 as p-GaN, it can be doped with Mg or C dopants with an exemplary doping density in the range from $1 \times 10^{16}$ cm$^{-3}$ to $1 \times 10^{19}$ cm$^3$; For layer 11 as AlGaN or InGaN, it can be intrinsic with Al content/In content in the range from 0.04 to 0.1; For layer 11 as p-diamond, it can be doped with p-type dopants such as B with an exemplary doping density in a range from $1 \times 10^{16}$ cm$^3$ to $1 \times 10^{21}$ cm$^{-3}$. The dopants in the layer 11 can be added during epitaxial growth or can be added by ion implantation after the layer 11 is formed.

An unintentionally-doped (UID) semiconductor buffer layer 12 (region 12) is disposed on the back-barrier layer 11 with an exemplary thickness of 100 nm to 200 nm. The material of the UID semiconductor buffer layer 12 can be III-nitride or III-arsenide materials. An n-type doped semiconductor layer 13 is disposed on the UID buffer layer 12. The n-type doped semiconductor layer 13 may be referred to as a second doped layer 13. The n-type doped semiconductor layer 13 can be a thin n-doped layer or an n-type delta-doped layer. In one embodiment, materials of the doped layer 13 can be Si delta-doped GaN layer with sheet doping density in the range from $1 \times 10^{12}$ cm$^{-2}$ to $1 \times 10^{13}$ cm$^{-2}$, and the thickness of delta-doped GaN layer is in the range from monolayer to a few multilayers (2.5 Å to 10 Å). According to some embodiments, various methods can be adopted for the formation of Si delta-doped GaN layer 13 with a high n-doping density, including but not limiting to a chemical vapor deposition (CVD), a metal-organic chemical vapor deposition (MOCVD), a molecular beam epitaxy (MBE) and a metal-organic vapor phase epitaxy (MOVPE).

In some embodiments of the invention, a thickness of the first doped layer is greater than a thickness of the second doped layer.

An unintentionally-doped (UID) channel layer 14 is disposed on the n-type doped semiconductor layer 13. The thickness of the channel layer 14 may be in a range from 10 nm to 40 nm. In some embodiments, the material of the channel layer 14 can be III-V materials.

An unintentionally-doped compound semiconductor barrier layer 15 is disposed on the channel layer 14. The thickness of the barrier layer 15 may be a few nanometers (2 nm to 4 nm). The material of the barrier layer 15 has a different lattice constant and bandgap energy compared to the material of the channel layer 14. In some embodiments, a 2DEG channel is formed at the heterostructure of the barrier layer 15 and the channel layer 14 due to polarizations. In some cases, the materials of barrier layer 15 and channel layer 14 can be AlGaN and GaN, InAlN and GaN, AN and GaN, or InAlGaN and GaN. An n-doped compound semiconductor barrier layer 16 is disposed on the unintentionally-doped layer 15 with doping density ranging from $1 \times 10^{18}$ cm$^{-3}$ to $3 \times 10^{18}$ cm$^{-3}$, and with thickness ranging from 13 nm to 20 nm. The n-doped compound semiconductor barrier layer 16 may be referred to as a first doped layer 16.

Another unintentionally-doped semiconductor barrier layer 17 is disposed on the n-type semiconductor barrier layer 16, with an exemplary thickness of a few nanometers (2 nm to 4 nm). The material of semiconductor layers 15, 16 and 17 are preferred to be the same and can be compound III-V semiconductor materials such as AlGaN, InAlN and InAlGaN. Further, the semiconductor layers 15, 16 and 17 may be referred as an i-n-i barrier layer or a barrier layer. The barrier layer may have a total thickness ranging from 18 nm to 25 nm, in which a thickness of the n-type semicondutor barrier layer 16 is varired between 13 nm and 20 nm.

In some embodiments of the invention, the unintentionally-doped semiconductor barrier layers 15 and 17 may be referred to as the first barrier layers, and the back barrier 11 may be referred to as the second barriers. In this case, the materials of the first and second barrier layers may be selected such that a lattice mismatch between the barrier layers and the channel layer is in range of approximately ±1 percent of the lattice constant of the channel layer. This selection can be effective to reduce crystal strain and defects in the semiconductor device structure.

According to some embodiments, various methods can be adopted for the formation of the compound semiconductor layer 14 to the UID barrier layer 17, including but not limiting to a chemical vapor deposition (CVD), a metal-organic chemical vapor deposition (MOCVD), a molecular beam epitaxy (MBE) and a metal-organic vapor phase epitaxy (MOVPE).

In some embodiments of the invention, the substrate 10 may be selected for supporting the layers 11 through 17 and such that a thermal conductivity of the substrate 10 is greater than at least one of materials of the channel layer 14 and the barrier layer 11. Further, the materials of the first and second barrier layers may be selected such that a lattice mismatch between lattice constants of the first and second barrier layers and a lattice constant of the channel layer is in range of approximately ±1 percent of the lattice constant of the channel layer, which reduces crystal defects in the semiconductor device.

The set of electrodes includes the source electrode S 1, the T-shape gate electrode G 1 and drain electrode D 1. The left part of T-shape gate electrode $L_g1$ can be fixed at 0.05 μm. In some embodiments, the center part of T-shape gate electrode $L_g2$ and the right part of T-shape gate electrode $L_g3$ can be in the range of 0.05 μm to 0.5 μm and 0.1 μm to 0.3 μm, respectively. In one embodiment, the distance between the barrier layer 17 to the lower side of the gate electrode $H_1$, the height of source/drain electrode $H_2$ and the height of T-gate electrode $H_3$ are 0.1 μm, 0.2 μm and 0.3 μm, respectively. In some embodiments, the material to form source/drain electrode S 1 /D 1 can be Ti/Al/Ni/Au metal stack for ohmic contact, and Schottky T-gate electrode G 1 can be formed by Ni/Au metal stack or Pt metal.

In some other embodiments, a dielectric layer 18 (dielectric region 18) can be formed as a passivation layer. The dielectric layer 18 can include a single or multiple insulating layers, with the materials including but not limiting to $Al_2O_3$, $SiO_2$, AlN, $SiN_x$, $HfO_2$, nanocrystalline diamond.

Figure 2:
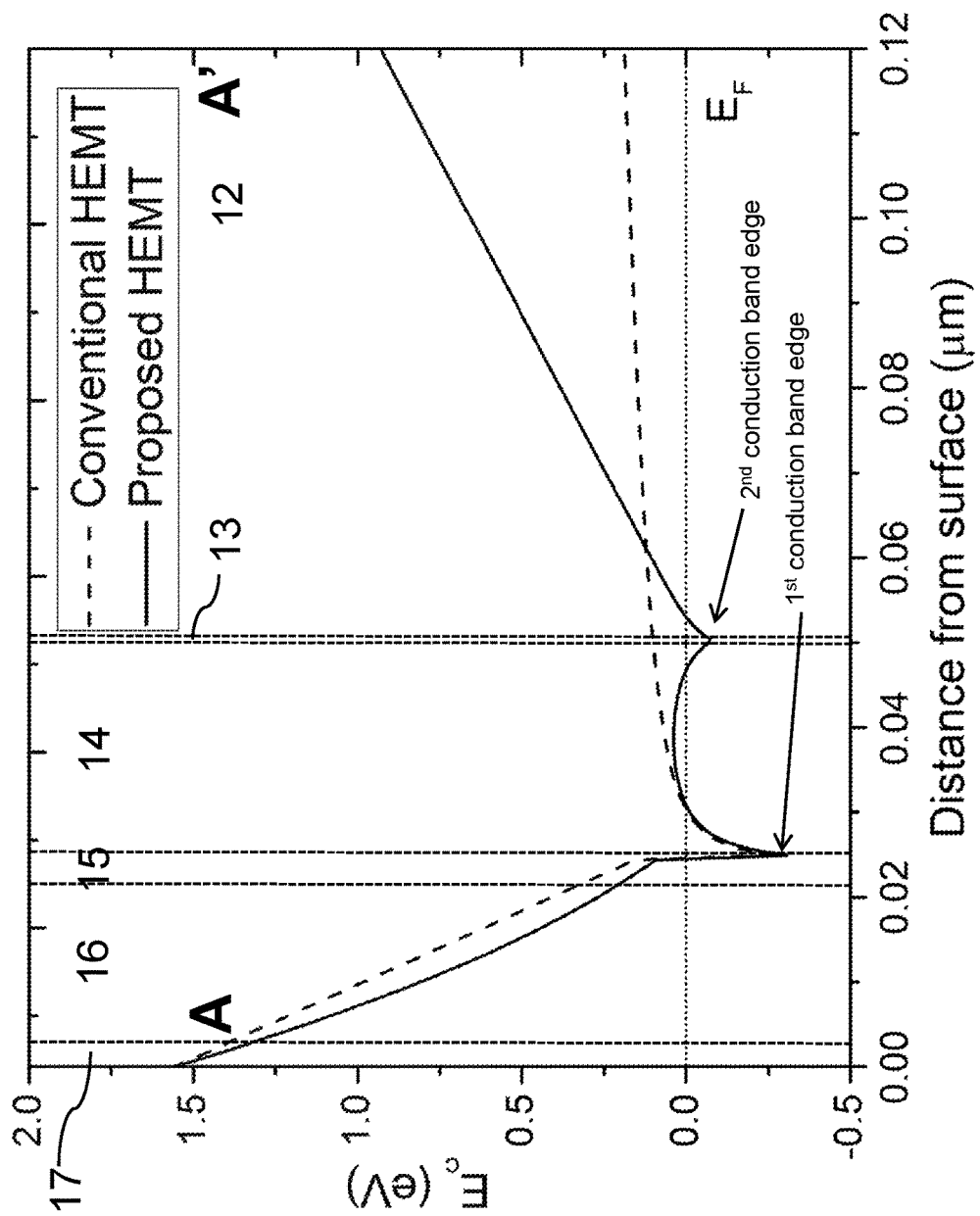
FIG. 2 shows a comparison of conduction band diagrams of a conventional HEMT structure and a proposed HEMT structure.

According to some embodiments of the invention, FIG. 1B and FIG. 1C show an example device structure referred to as a proposed semiconductor device, which has layers having sized and compositions as follows:

Substrate layer 10: SiC
Back-barrier layer 11: 1.8 µm p-GaN with doping density of $1\times10^{17}$ cm$^{-3}$
Unintentionally-doped (UID) buffer layer 12: 0.2 µm UID-GaN layer
n-type delta-doped semiconductor layer 13: 1 nm n-GaN with doping density of $6\times10^{19}$ cm$^{-3}$
Unintentionally-doped (UID) channel layer 14: 25 nm UID-GaN layer
Unintentionally-doped barrier layer 15: 3 nm UID-Al$_{0.3}$Ga$_{0.7}$N layer
n-doped barrier layer 16: 13 nm or 20 nm n-Al$_{0.3}$Ga$_{0.7}$N layer with doping density of $2\times10^{18}$ cm$^{-3}$
Unintentionally-doped barrier layer 17: 2nm UID-Al$_{0.3}$Ga$_{0.7}$N layer
Dielectric layer 18: 0.5 µm Si$_3$N$_4$
Distance between layer 17 to the lower side of gate electrode H$_1$: 0.1 µm
Source/Drain electrode S 1 /D 1 height H$_2$: 0.2 µm
Gate electrode G 1height H$_3$: 0.3 µm
Thickness of left part of T-shape gate electrode L$_g$1: 0.05 µm
Thickness of center part of T-shape gate electrode L$_g$2: 0.2 µm
Thickness of right part of T-shape gate electrode L$_g$3: 0.1 µm FIG. 2 shows simulated conduction band diagrams of the cross-line AA' within the proposed device of FIG. 1C. For comparison, a reference structure referred as a conventional HEMT, in which the delta-doped layer 13 is not included and the layers 11 and 16 are undoped layers, is also simulated. As shown, at the interface between the heterostructure formed by layers 14 and 15, the conduction band E$_c$ dips below the Fermi level E$_F$ at equbibrium as indicated as a first conduction band edge in the figure, which provides a main channel. The electrons are induced at the hetero structure due to the piezoelectric polarization and spontaneous polarization that form a 2DEG sheet charge region at the heterostructure. Further, in the proposed HEMT, electrons are also provided from the n-doped layer 16 to the main channel. In the conventional HEMT, the conduction band is relatively flat from the channel layer 14 to the UID buffer layer 12 since the delta-doped layer 13 and the doped back-barrier layer 11 are not introduced. As a result, the electrons in the 2DEG channel would easily spill over to the buffer layer 12 under bias conditions, resulting in current flowing within the GaN buffer layer. The situation would be more serious when the gate length is small (under 0.2 µm), in which the short channel effect would dominate in transistor operations. By introducing a heavily n-type delta-doped GaN layer 13, a minor channel can be created in the proposed HEMTs, which would greatly improve access resistance therefore enhance the linearity of the transconductance. The minor channel at a second conduction band edge provides additional electrons as carrier charges. Under the bias conditions during transistor operations, additional electrons in the minor channel are smoothly tranferred to the main channel in a wide range of biases applied to the gate and source electrodes. This carrier transfer mechanism greatly improves the linearity of the transconductance. In a case of the conventional HEMT, in which the n-type delta-doped layer 13 is not introduced, the electrons in the main channel become insufficient in the wide bias range, which results in a poor linearity of the transconductance as indicated in FIG. 3.

In some embodiments, a distance of the first conduction band edge from the Fermi level is selected so as to be greater than a distance of the second conduction edge from the Fermi level at an equilibrium condition (non-biased condition).

The n-doped layer 16 is formed for eliminating the influence of the delta-doped layer 13 on the 2DEG to provide a high carrier density in the major channel. And the back-barrier layer 11 is a p-type GaN, which pulls up the conduction band of buffer layer 12, resulting in much better electron confinement in both major and minor channel. The carrier spill-over and short channel effect can be suppressed to some extents.

Figure 3:
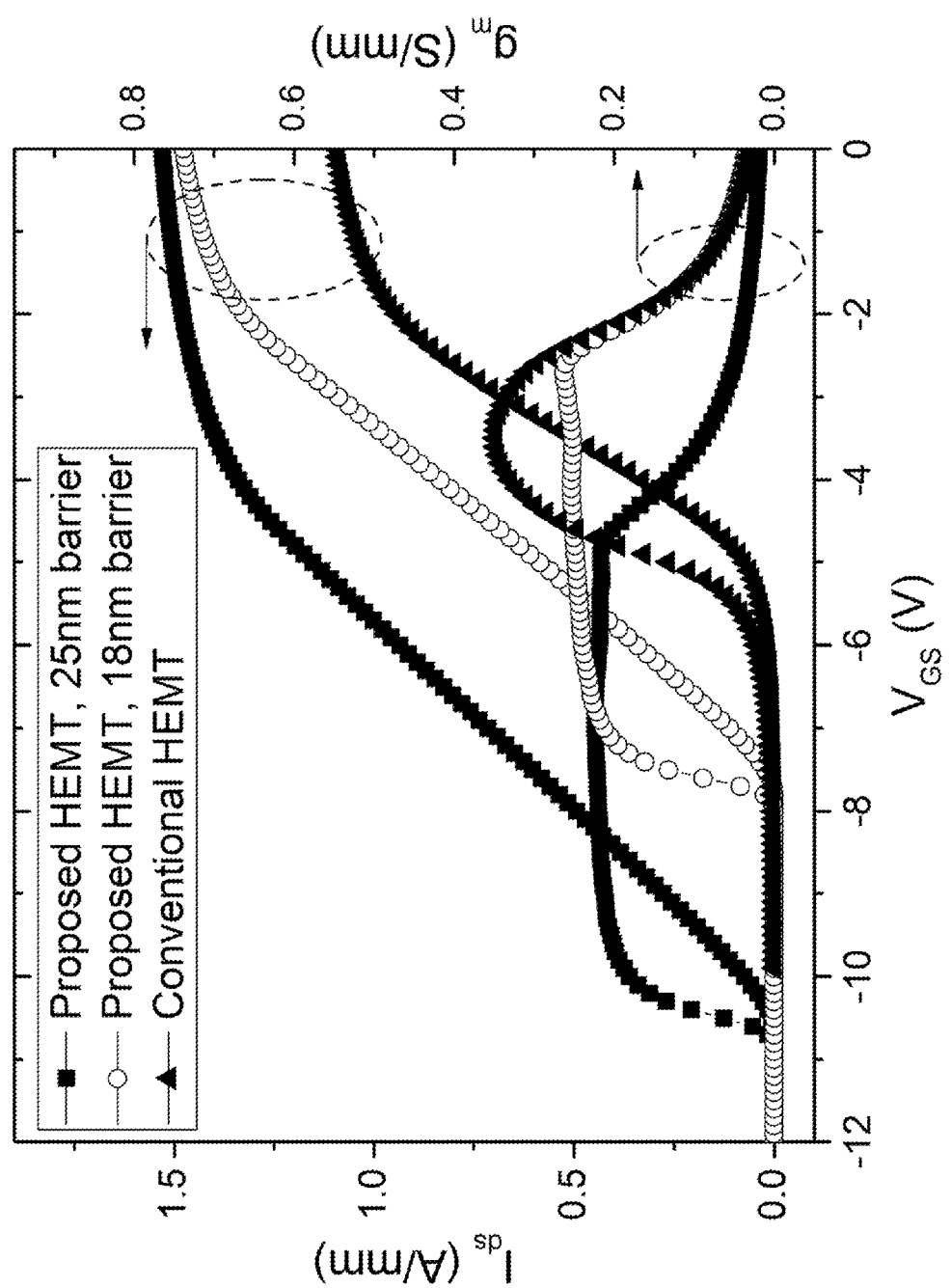
FIG. 3 shows a comparison of transfer characteristics of a conventional HEMT structure and a proposed HEMT structure with a 18 nm or 25 nm barrier and Lg_2=200 nm.

FIG. 3 shows the simulated transfer characteristics at $V_{ds}$=3V of the proposed HEMT with a 18 nm thick or 25 nm thick i-n-i barrier layer (the layers 15, 16 and 17) and the conventional HEMT. The threshold voltages ($V_{th}$) of the conventional HEMT and the proposed HEMTs with 18 nm and 25 nm barrier layers are −5.8V, −7.9V and −10.8V, respectively. The threshold voltages of the proposed HEMTs shift to the negative side from the positive side. The shifts of the threshold voltages are due to the formation of the minor channels and more electrons residing under the gate electrode. FIG. 3 indicates that nearly flat transconductances ($g_m$) are achieved over a wide gate bias ($V_{gs}$) range of −7V to −1.5V, and −10V to −4.6V for the proposed HEMT with a 18 nm or a 25 nm barrier layer, respectively.

The proposed HEMTs having a 25 nm barrier layer and a 18 nm barrier layer provide transconductances ($g_m$) with ultra-flat regions remaining close to respective great values of the $g_m$ over a wide range of gate-source voltages ($V_{gs}$). The flat region of a transconductance reflects to a linearity of amplification of a transistor. Accordingly, the transconductance characteristics of the proposed HEMTs are desirable features for achieving linear operation of the large-signal power amplifiers.

A transconductance of a conventional HEMT, which does not include the δ-doped layer, the doped back barrier layer and the doped barrier, is also shown in FIG. 3 for comparison. It is indicated that the transconductance of the conventional HEMT does not have a flat region, in contrast to the proposed HEMTs, which show a superior linearity of the transconductance.

FIG. 3 also indicates that the proposed HEMTs have other advantages in suppressing short channel effect as well as obtaining large on-state currents.

Figure 4A:
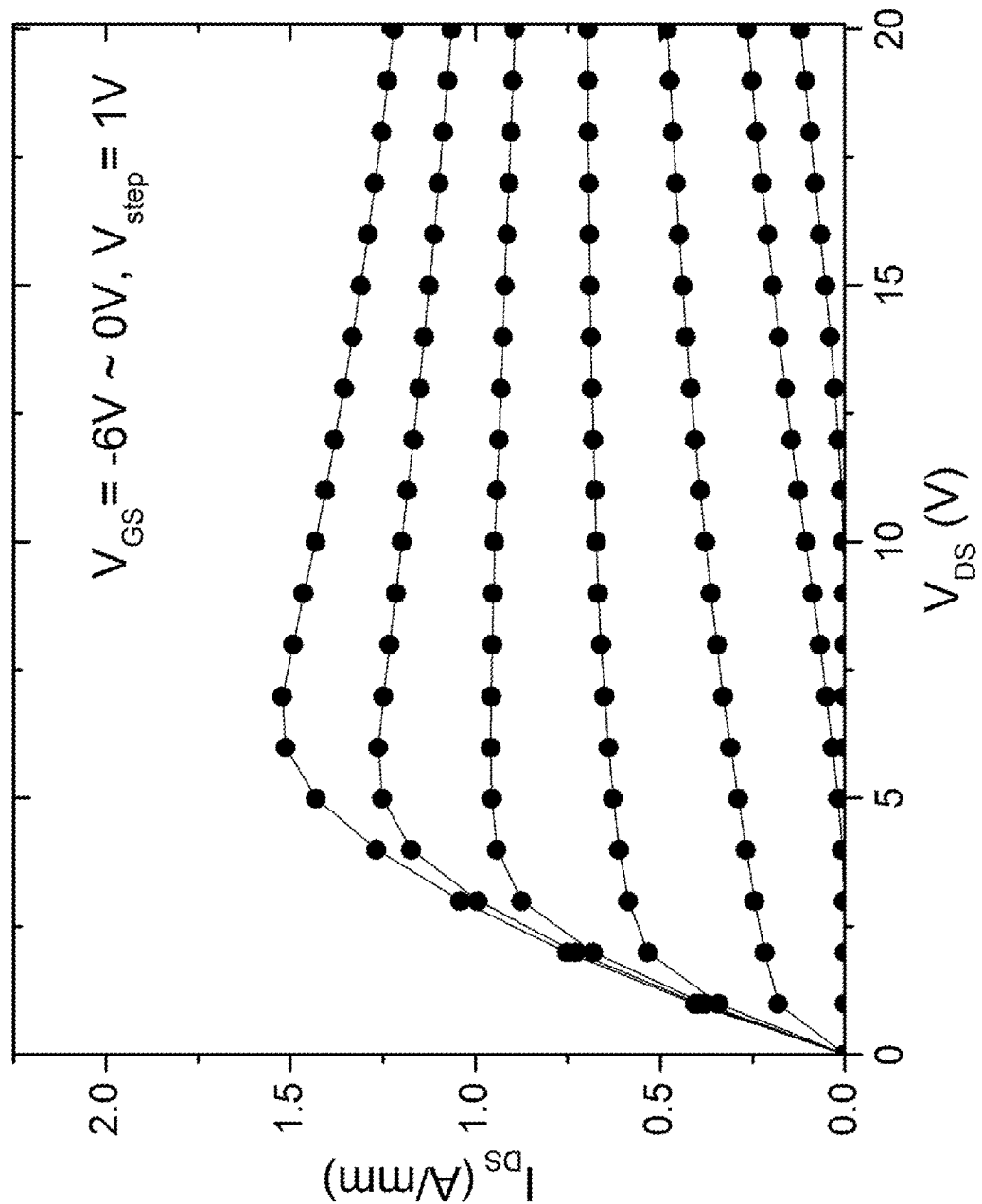
FIG. 4A shows I-V characteristics of a conventional HEMT structure with Lg_2=200 nm.
Figure 4B:
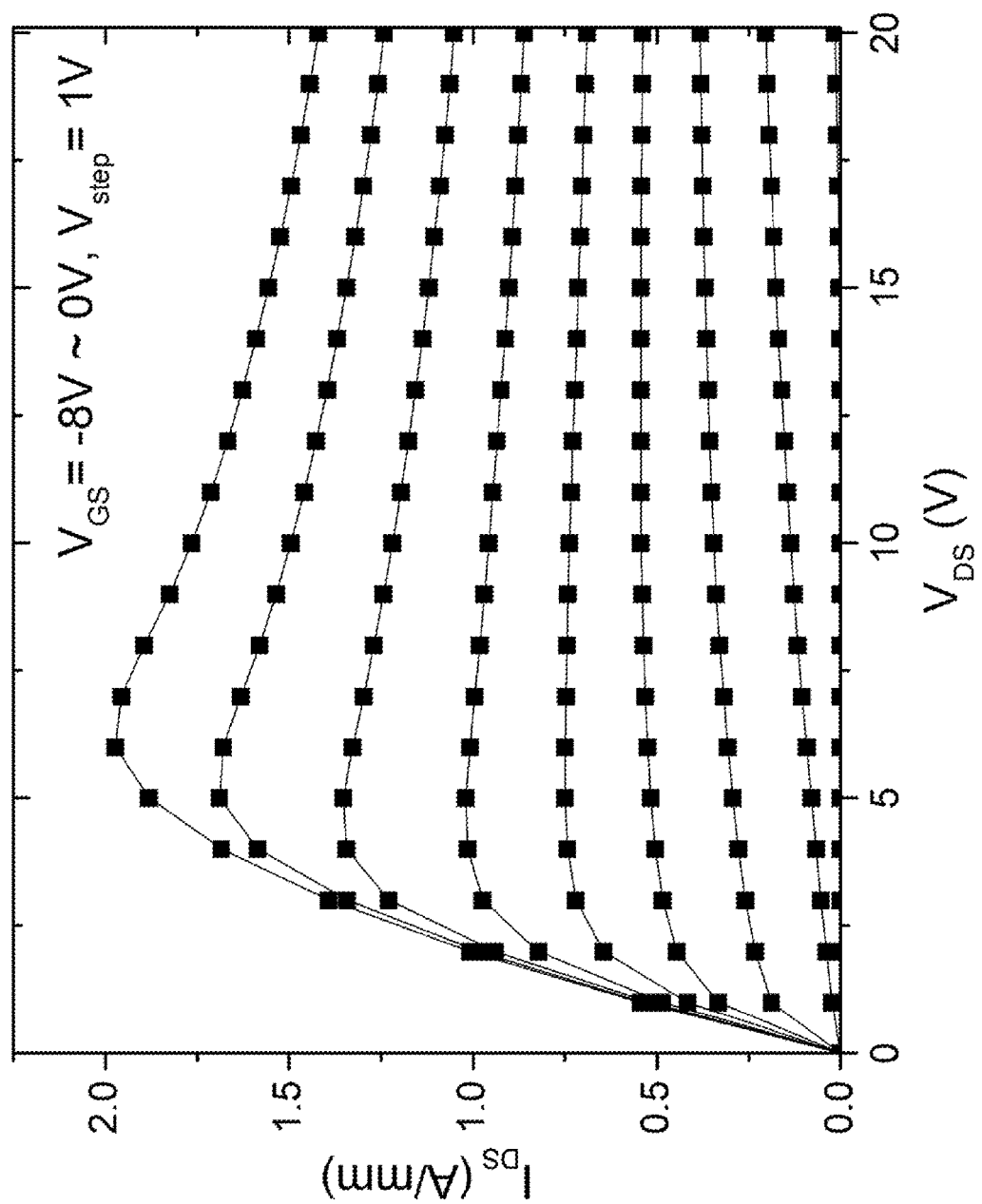
FIG. 4B shows I-V characteristics of a proposed HEMT structure with Lg_2=200 nm.

FIG. 4A and FIG. 4B show I$_d$-V$_d$ characteristics of the conventional HEMT and the proposed HEMT with a 18 nm barrier layer (layers 15, 16 and 17), respectively. The center part of T-gate L$_g$2 is fixed at 0.2 µm and a thermal model is enabled for both cases. A typical behavior is observed on the conventional HEMT with a small gate length: The loss of saturation in the output characteristic caused by the inability of the short gate to completely deplete the electric charge in the channel. This behavior is eliminated on the proposed HEMT due to the enhanced carrier confinement by adding a back-barrier layer 11. In addition, the maximum output currents at $V_{gs}$=0V for conventional HEMT and proposed HEMT are 1.97 A/mm and 1.52 A/mm, respectively. The higher output current presents on the proposed HEMT is due to an effect of a minor channel formed by by the delta-doping layer 13 and smooth carrir communication between the two channels achieved by optimizing the thickness of the channel layer 14.

Figure 5:
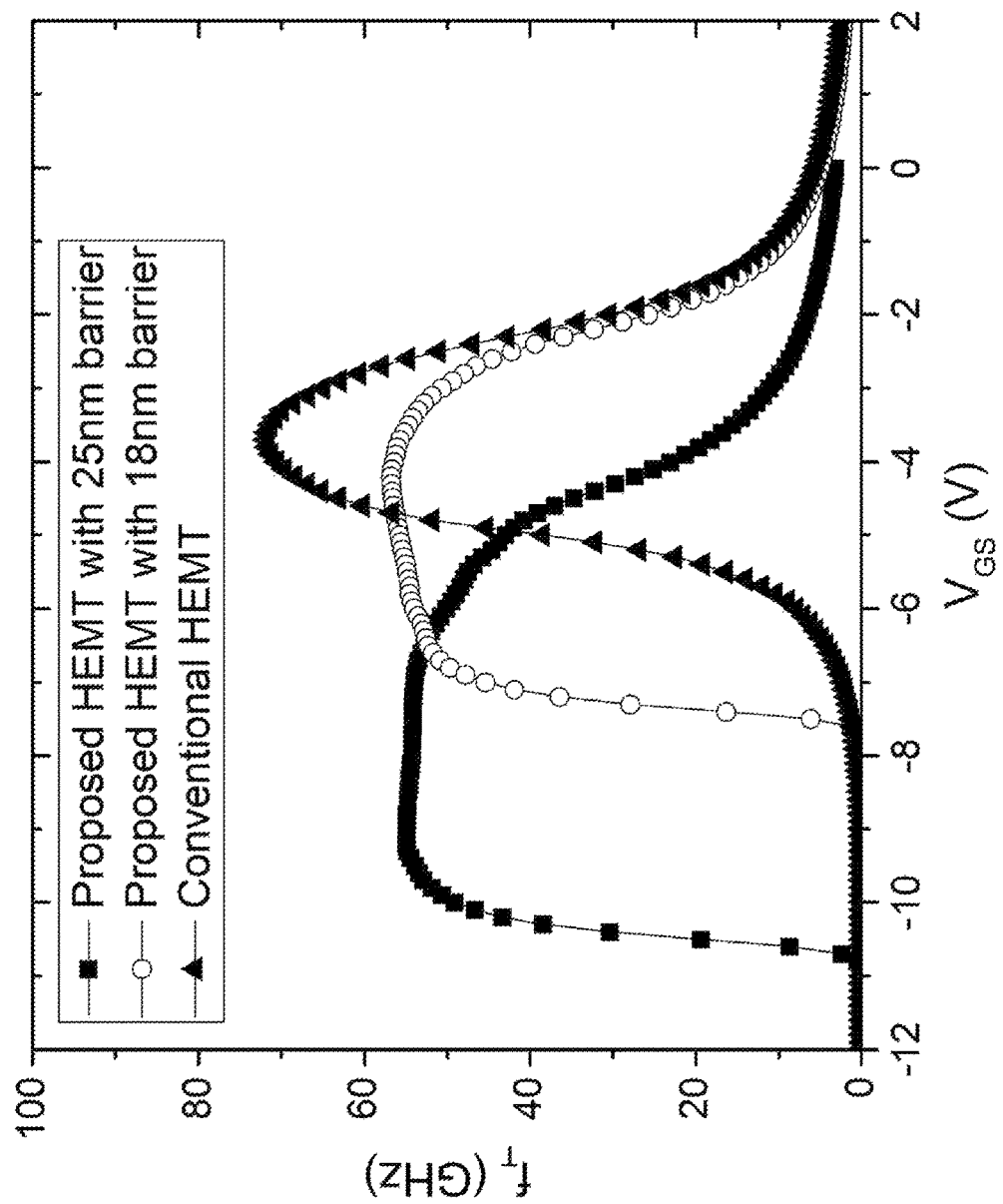
FIG. 5 shows a comparison of current gain cutoff frequencies of a conventional HEMT structure and proposed HEMT structure with a 18 nm or 25 nm barrier layer; Lg_2=200 nm, $V_{ds}$=3V and the ac simulation was conducted at f=1 MHz.

FIG. 5 shows current gain cutoff frequences as a function of $V_{gs}$ of the conventional HEMT and proposed HEMTs with 18 nm and 25 nm barrier layers (layer 15, 16 and 17)

for comparison. In this case, two proposed HEMT structures having a 18 nm and a 25 nm barrier layer with a gate length Lg_2=200 nm are indicated.

Device transfer characteristics were simulated in ac mode at $V_{ds}=3V$, and a transconductance $g_m$ and gate capacitances $C_{gd}$ and $C_{gs}$ were extracted as a function of $V_{gs}$. The intrinsic cutoff frequency $f_T$ was calculated by:

$$f_T = \frac{g_m}{2\pi C_{gs}\sqrt{1+2(C_{gd}/C_{gs})}}$$

As shown in FIG. 5, plateau regions (flat regions) of $g_m$ are obtained for the proposed HEMTs with 18 nm and 25 nm barrier layers over the gate biases $V_{gs}$ from −7V to −2.5V and −10V to −5V. In contrast, the conventional HEMT does not have a plateau region of $g_m$ and shows the peak at $V_{gs}$=−3.7V and drops significantly with $V_{gs}$. The highly flat $f_T$ (plateau region of $g_m$) behaviors on the proposed HEMTs are due to the flat $g_m$ achieved, and remain close to respective peak values when $V_{gs}$ varies. These charateristics of $f_T$ are desirable features for achieving linear operations of the large-signal power amplifiers.

Figure 6:
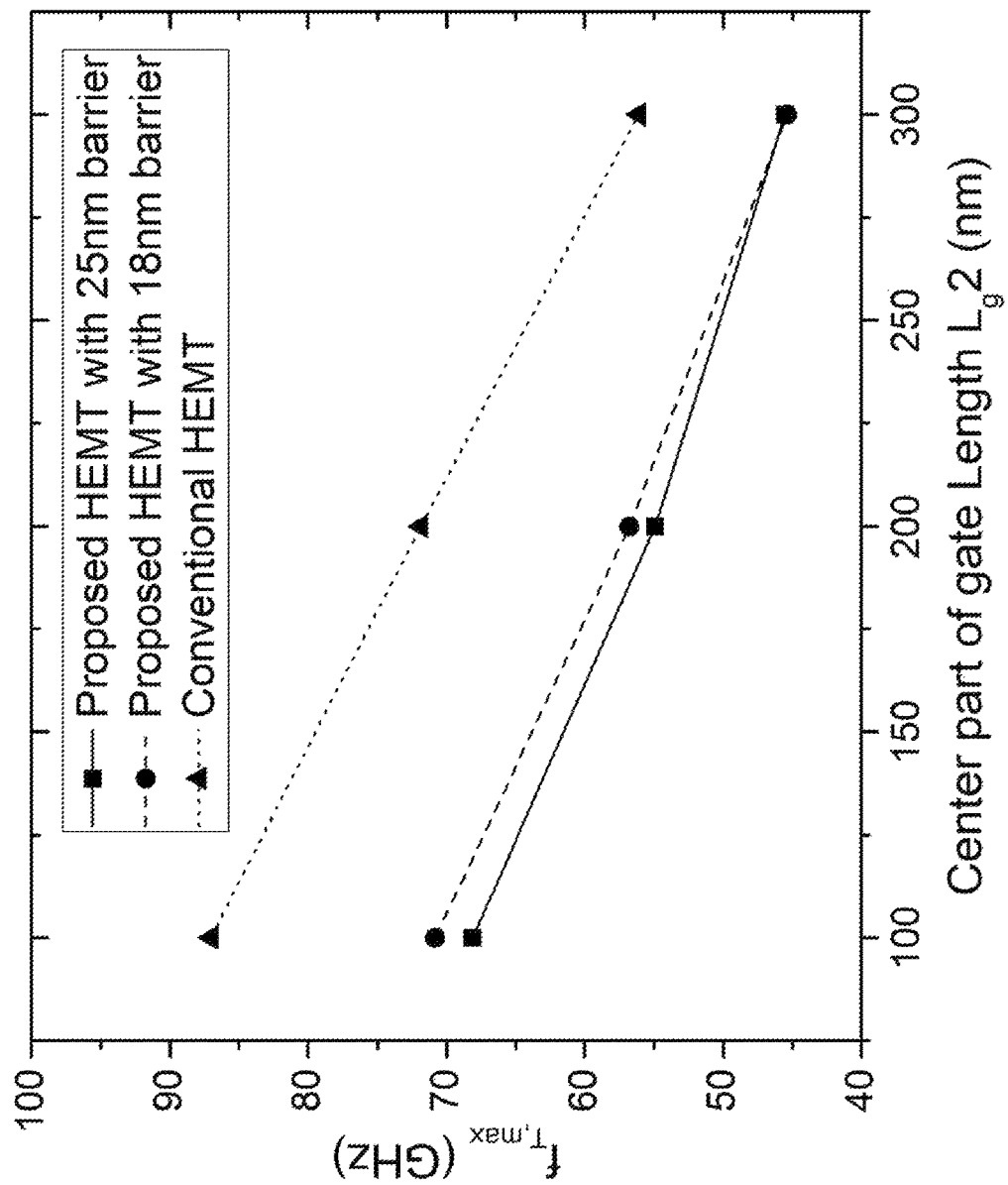
FIG. 6 shows a comparison of current gain cutoff frequencies as a function of gate length in conventional structure and proposed structure with 18 or 25 nm barrier. $V_{ds}$=3V and the ac simulation was conducted at f=1 MHz.

FIG. 6 shows the maximum intrinsic cutoff frequency $f_{T.max}$ as a function of center gate length $L_g2$. The intrinsic cutoff frequency $f_T$ was calculated for each $V_{gs}$ and the peak $f_T$ was extracted. As shown, $f_{T.max}$ increases with decreasing the center gate length $L_g2$. This increase is due to smaller gate capacitances. In addition, a 20% lower $f_{T.max}$ is observed in the proposed HEMT with a 18 nm barrier, since there is a trade-off between improving device linearity and enhancing $f_{T.max}$ in the proposed HEMT. FIG. 6 also indicates that further increase of $f_{T.max}$ would be achieved by scaling $L_g2$ down below 0.1 μm, however, short channel effect would become more serious. It needs to further improve carrier confinement and optimize the ratio between $L_g2$ and a barrier thickness (region 15, 16 and 17) to suppress the short channel effect.

Figure 7:
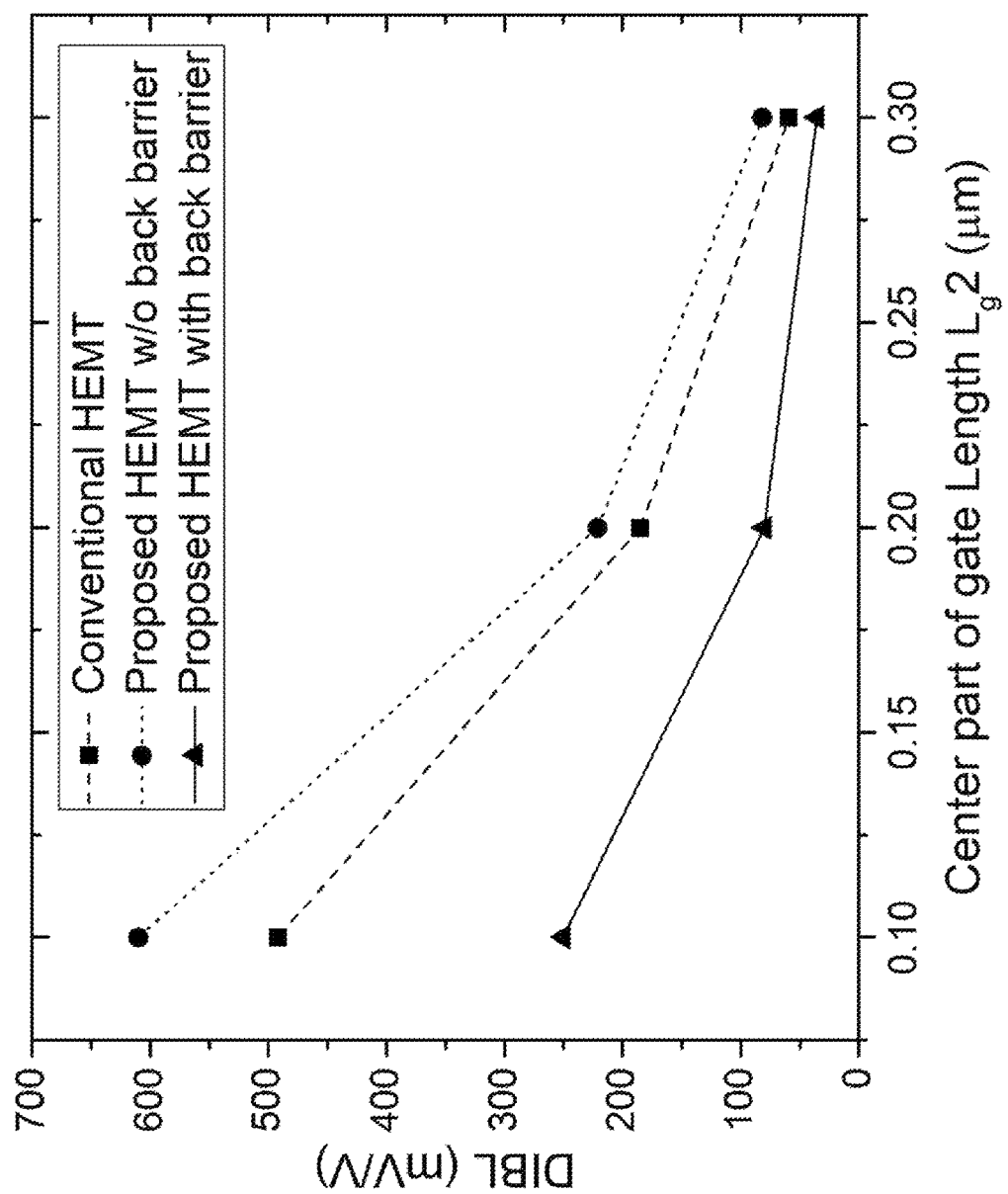
FIG. 7 shows a comparison of drain induced barrier lowering as a function of gate length in conventional structure and proposed structure with 18 or 25 nm barrier. $V_{th}$ is defined when $I_{ds}$ reaches 0.1 mA/mm.

FIG. 7 shows the value of drain-induced barrier lowering (DIBL) (defined as $V_{th}/V_{ds}$ and $V_{ds}$ of 1 and 10 V used in the simulation) as a function of center gate length $L_g2$ in the conventional HEMT and the proposed HEMTs with or without the back barrier layer 11. The drain-induced barrier lowering (DIBL) is a short-channel effect in FETs referring originally to a reduction of a threshold voltage of the transistor at higher drain voltages, which needs to keep as low as possible for device operations. In the proposed HEMT structure without the back barrier layer 11, the DIBL is more serious than the conventional HEMT due to the lowering of the conduction band in the buffer layer 12 caused by the delta-doped layer 13. The back barrier layer 11 is essential to solve the trade-off between improving linearity and suppressing the short channel effect when the delta-doped layer 13 is introduced. Thanks to the back barrier layer 11 introduced in the proposed HEMT, the proposed HEMTs with a short gate show not only a much smaller value of DIBL but also a significant improvement in the subthreshold slope (shown in FIG. 3).

A combination of the thickness of the unintentionally doped buffer layer 12 and the doping density of the back barrier layer 11 is chosen to achieve better carrier confinements as well as higher linearity of operations.

Figure 8:
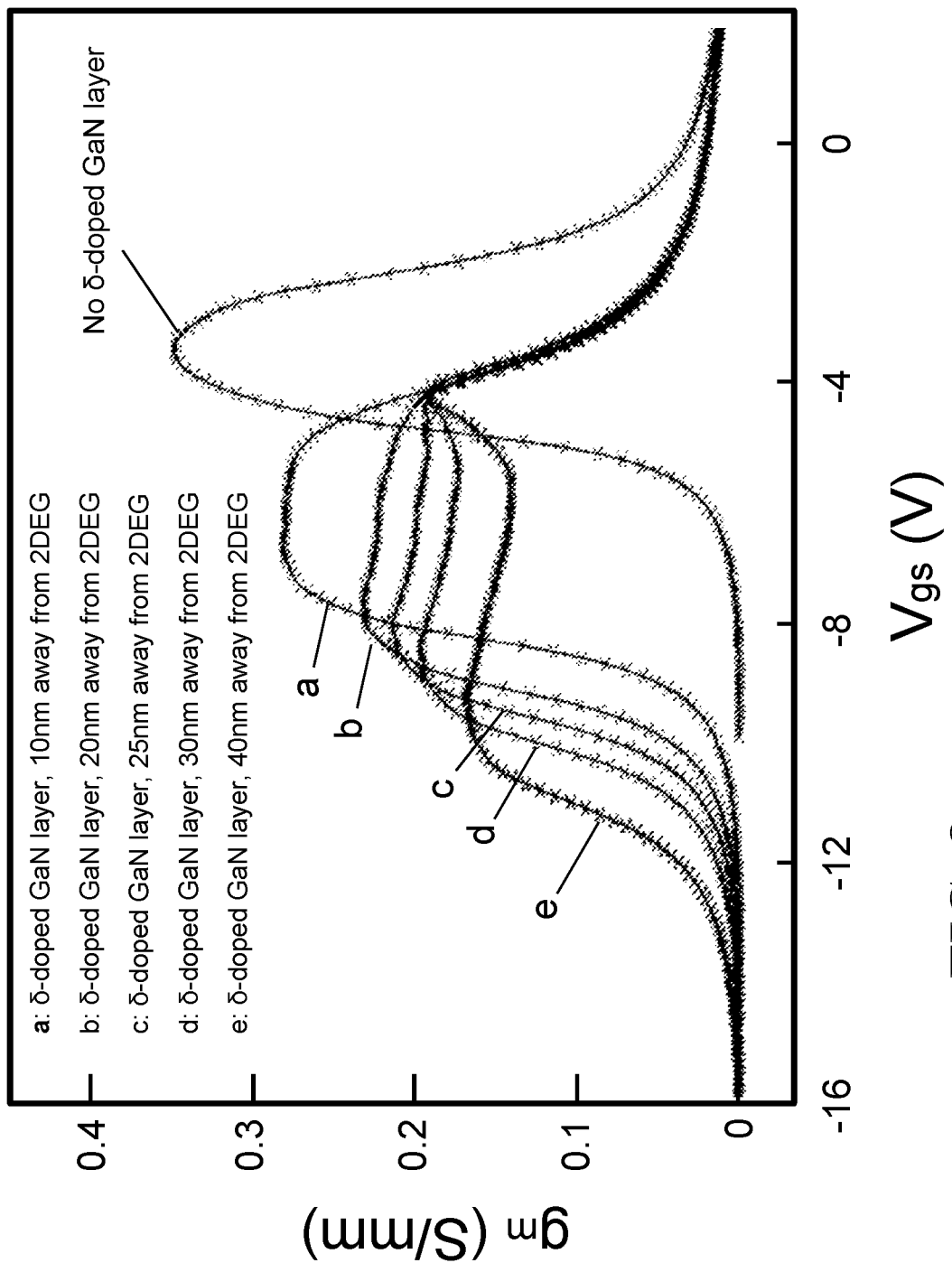
FIG. 8 shows transconductance profiles of HEMTs with delta-doped layer inserted.

FIG. 8 shows transconductance profiles of the HEMTs with and without delta-doped layer 13. No back barrier layer 11 added because of a comparison purpose.

If the unintentionally doped (UID) layer 12 is too thin, and/or the doping density of the back-barrier layer 11 is too high, the conduction band in the location of the delta-doped layer 13 would be pulled up without forming a minor channel, resulting in a poor linearity of device operations. On the other hand, if the UID layer 12 is too thick, and/or the doping density of the back-barrier layer 11 is too low, the short channel effect would greatly affect the device performance of the HEMT due to the failure of channel carrier confinement. In some embodiments, the thickness of the unintentionally doped layer 12 can be chosen from 100 nm to 200 nm, and the doping density in the p-GaN back-barrier layer 11 can be chosen from $5\times10^{16}$ $cm^{-3}$ to $5\times10^{17}$ $cm^{-3}$.

The thickness of the UID channel layer 14 should can be designed as follows. With increasing in the thickness of the UID channel layer 14, the wider region of the transconductance ($g_m$) would be achieved. However, the transconductance $g_m$ profile tends to show a two-peak behavior rather than a flat region when the thickness of the channel layer 14 increases beyond a threshold thickness. In some cases, the channel layer 14 can be in a range from 20 nm to 30 nm. It is due to the creation of a relatively wide barrier between the major channel and the minor channel, resulting in a double channel device that avoids the communication between the two channels. The preferred thickness of UID channel layer 14 may be fromed between 20 nm and 30 nm.

The doping density of the delta-doped layer 13 should also be carefully designed to the improve device linearity. Too high or too low delta-doped density would result in a two-peak behavior rather than a flat region. A preferable range of the sheet doping density of delta-doped layer 13 may be from $4\times10^{12}$ $cm^{-2}$ to $6\times10^{12}cm^{-2}$. Overall, the linearity performance and carrier confinement are determined by the combination of thicknesses of the unintentionally doped layer 12, the UID channel layer 14, and the doping densities of the back-barrier layer 11 and the delta-doped layer 13.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format.

Also, the embodiments of the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Although the invention has been described by way of examples of preferred embodiments, it is to be understood that various other adaptations and modifications can be made within the spirit and scope of the invention.

Therefore, it is the object of the appended claims to cover all such variations and modifications as come within the true spirit and scope of the invention.

We claim:

1. A semiconductor device, comprising:
a semiconductor structure including an i-n-i barrier layer consisting of undoped layers and a first doped layer configured to provide a carrier charge into a carrier channel;
a second doped layer having a conductivity type identical to a conductivity type of the first doped layer, wherein the second doped layer is a delta doping (δ-doping) layer having a doping density greater than a doping density of the first doped layer;
a back barrier layer arranged in proximity to the semiconductor structure via the second doped layer, wherein the back barrier layer includes a partially doped layer having a conductivity type opposite to the conductivity type of the second doped layer; and
a set of electrodes for providing and controlling the carrier charge in the carrier channel.

2. The semiconductor device of claim 1, wherein the second doped layer is a delta doping (δ-doping) layer having an n-type doping density greater than a doping density of the partially doped layer of the back barrier layer.

3. The semiconductor device of claim 1, wherein the delta doping (δ-doping) layer is n-type doping layer.

4. The semiconductor device of claim 1, wherein a thickness of the first doped layer is greater than a thickness of the second doped layer.

5. The semiconductor device of claim 1, wherein a thickness of the partially doped layer is greater than a thickness of the second doped layer.

6. The semiconductor device of claim 1, wherein the second doped layer is a delta doping (δ-doping) layer having an n-type doping density ranging from $4 \times 10^{19}$ cm$^{-3}$ to $6 \times 10^{19}$ cm$^{-3}$.

7. The semiconductor device of claim 1, wherein the second doped layer is arranged away from the carrier charge of the carrier channel in a range from 10 nm to 30 nm.

8. The semiconductor device of claim 1, wherein the carrier channel is formed of an undoped channel layer having a thickness in a range from 20 nm to 30 nm.

9. The semiconductor device of claim 1, wherein a doping density of the partially doped layer in the back barrier layer is in a range from $5 \times 10^{16}$ cm$^{-3}$ to $5 \times 10^{17}$ cm$^{-3}$.

10. The semiconuctor device of claim 1, wherein the back barrier layer includes an unintentionally doped layer having a thickness ranging from 100 nm to 200 nm, and wherein the unintentionally doped layer is arranged between a second carrier channel and the partially doped layer.

11. The semiconductor device of claim 1,
wherein the carrier channel is an undoped channel layer and
the first doped layer is disposed between the undoped layers.

12. The semiconductor device of claim 1, wherein a material of the carrier channel and a material of the second doped layer are formed of an identical material.

13. The semiconductor device of claim 1, wherein the i-n-i barrier layer and the carrier channel are III-V material layers, wherein a bandgap of the i-n-i barrier layer is greater than a bandgap of the carrier channel.

14. The semiconductor device of claim 13, wherein a material of the carrier channel includes one or combination of gallium nitride (GaN) and indium gallium nitride (InGaN), and a material of-the i-n-i barrier layer includes one or combination of aluminum gallium nitride (AlGaN), indium aluminum nitride (InAlN), aluminum nitride (AlN) and indium aluminum gallium nitride (InAlGaN).

15. A semiconductor device, comprising:
a semiconductor structure including a channel layer and first barrier layers for providing a carrier charge, wherein the channel layer is an undoped layer and the first barrier layers consist of an undoped barrier layer, a first n-type doped barrier layer and another undoped barrier layer;
a second n-type doped layer adjacent to the channel, wherein the second doped layer is a delta doping (δ-doping) layer having a doping density greater than a doping density of the first doped layer;
a second barrier layer arranged in proximity to the semiconductor structure via the second n-type doped layer, wherein the second barrier layer includes at least partially p-typed doped layer; and
a set of electrodes for controlling the carrier charge in the carrier channel.

* * * * *